United States Patent [19]

Beckenbaugh et al.

[11] 4,181,750
[45] Jan. 1, 1980

[54] METHOD OF DEPOSITING A METAL ON A SURFACE

[75] Inventors: William M. Beckenbaugh, East Amwell Township, Hunterdon County; Patricia J. Goldman, Ewing Township, Mercer County; Kim L. Morton, Delaware Township, Hunterdon County, all of N.J.

[73] Assignee: Western Electric Company, Inc., New York, N.Y.

[21] Appl. No.: 831,824

[22] Filed: Sep. 9, 1977

[51] Int. Cl.² ........................ B05D 3/06; G03D 5/00
[52] U.S. Cl. ............................ 430/414; 427/98; 427/306; 427/430 A; 430/317; 430/417; 430/423
[58] Field of Search .............. 427/306, 53, 430 A, 427/98, 304, 305

[56] References Cited

U.S. PATENT DOCUMENTS

| | | | |
|---|---|---|---|
| 3,619,285 | 11/1971 | Feldstein | 427/306 |
| 3,632,435 | 1/1972 | Eriskson | 427/306 |
| 3,663,242 | 5/1972 | Gulla et al. | 427/306 |
| 3,722,078 | 11/1973 | Polichette et al. | 427/306 |
| 3,772,056 | 11/1973 | Polichette et al. | 427/306 |
| 3,907,621 | 9/1975 | Polichette et al. | 427/306 |
| 3,925,578 | 12/1975 | Polichette et al. | 427/306 |
| 3,930,963 | 1/1976 | Polichette et al. | 427/306 |
| 4,008,343 | 2/1977 | Cohen et al. | 427/306 |

*Primary Examiner*—John H. Newsome
*Attorney, Agent, or Firm*—Joel F. Spivak

[57] ABSTRACT

A method of depositing a metal on a surface is disclosed. The method comprises coating the surface with a sensitizing solution comprising at least a reducible salt of a non-noble metal. The coated surface is selectively treated to reduce the metal salt to metallic nuclei to form a catalytic pattern thereon capable of directly catalyzing the deposition of a metal on the nuclei from an electroless metal deposition solution. The selectively treated surface is then exposed to a stripping solution comprising an organic acid selected from (a) a carboxylic acid having a structural formula of

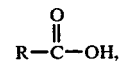

where R is a member selected from the hydrogen radical, H, and an alkyl group having 1 to 3 carbon atoms, (b) citric acid and (c) a mixture of any of the foregoing acids, to essentially remove portions of the coated surface which have not been selectively treated.

24 Claims, No Drawings

METHOD OF DEPOSITING A METAL ON A SURFACE

BACKGROUND OF THE INVENTION

1. Field of the Invention

This invention relates to a method of depositing a metal on a surface and more particularly, to a method of selectively depositing an electroless metal deposit on a surface.

2. Discussion of the Prior Art

Heretofore, it has been known to employ a number of pretreatment or sensitization baths in effecting the electroless deposition of metals on various surfaces. Typically, such prior art sensitization baths used commercially have been expensive because they depend upon a noble metal, e.g., Pd, Pt, Ag, Au, etc., as the sensitizing component. However, recently methods have been reported in which electroless metal deposits can be applied to a broad variety of insulating substrates without the need to use expensive noble metals but on the contrary, employ reducible salt compositions of non-noble metals. U.S. Pat. Nos. 3,772,056; 3,772,078; 3,907,621; 3,925,578; and 3,930,963 disclose such methods. A problem with the methods disclosed in these patents and not recognized or addressed thereby or therein is that of maintaining an electroless metal deposition solution active after employing the methods of these patents. It has been found that electroless metal deposition solutions go "critical" after only a relatively few exposures to substrates treated in the manner described in the above-identified patents. By going "critical" it is meant that the electroless deposition solutions decompose and lose their ability to have an electroless metal catalytically deposited therefrom. Accordingly, a method of eliminating this problem is desired and is needed.

SUMMARY OF THE INVENTION

This invention relates to a method of depositing a metal on a surface and more particularly, to a method of selectively metal depositing an electroless metal deposit on a surface.

The method includes coating the surface with a sensitizing solution comprising at least a reducible salt of a non-noble metal. A portion of the sensitized surface is selectively treated to form a catalytic real image. The real image containing surface is exposed to a stripper comprising an organic acid selected from the group consisting of (a) a carboxylic acid having the structural formula of

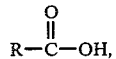

where R is a member selected from the group consisting of H, and an alkyl group having 1 to 3 carbon atoms, (b) citric acid and (c) a mixture of any of the foregoing acids to essentially remove untreated portions of the sensitized surface.

DETAILED DESCRIPTION

The present invention will be discussed primarily in terms of selectively depositing copper on a surface of a substrate. It will be readily appreciated that the inventive concept is equally applicable to depositing other suitable metals which are catalytically reduced from their respective ions by the catalytic surface areas produced by the subject invention. It will also be appreciated that the selective deposition is not limited to any one particular type of surface but is applicable to metallizing any surface whether used as a printed circuit board or not.

The present invention relates to imposing by (1) thermal energy, (2) radiant energy or (3) chemical reduction methods, sensitive, non-conductive areas on the surfaces of a substrate which catalyze the deposition of strongly adherent and continuous deposits of electroless metal. U.S. Pat. Nos. 3,772,056; 3,772,078; 3,907,621; 3,925,578; and 3,930,963, all of which are incorporated hereinto by reference, disclose a method of selectively metallizing a surface by coating with a composition comprising at least a reducible salt of a non-noble metal selected from copper, nickel, cobalt or iron, which is then converted to electrically non-conductive metal species nuclei, e.g., metal nuclei, capable of catalyzing the deposition thereon of a metal from an electroless metal deposition solution. However, when the methods described in the above-identified patents are used, it has been found that surfaces so treated in the manner of the above-identified patents and having catalytic, electrically non-conductive nuclei, rapidly decompose an electroless metal deposition solution used to treat such surfaces. In other words the electroless metal deposition solution goes critical and is unable to catalytically deposit an electroless metal therefrom after exposure to a relatively few in number of these treated surfaces (containing catalytic, electrically non-conductive nuclei), e.g., typically, one square foot of treated surface per 0.026 gallon of electroless metal deposition solution. It has been found that prolonged water rinsing or washing, e.g., 10 minutes at 25° C., of these so-treated surfaces, in the manner of the above-identified patents, does not obviate the criticality problem. It has been found that the criticality problem is obviated when the so-treated surface, in the manner of the above-identified patents, is treated with a selected organic acid or a mixture of selected organic acids.

A suitable substrate is first selected. Typical suitable substrates include bodies comprising inorganic and organic substances, such as glass, ceramics, porcelain, resins, paper, cloth and the like. Dielectric coated metal and unclad substances of the type described may be used. For printed circuits, among the materials which may be used as the bases, may be mentioned insulating thermosetting resins, thermoplastic resins and mixtures of the foregoing, including fiber, e.g., fiberglass, impregnated embodiments of the foregoing.

Porous materials, comprising paper, wood, fiberglass, cloth and fibers, such as natural and synthetic fibers, e.g., cotton fibers, polyester fibers, and the like, as well as such materials themselves, may also be metallized in accordance with the teachings herein.

Where radiant energy, such as ultraviolet radiation, is to be employed, preferred substrates are opaque to the transmission of radiant energy. This prevents "printing through" and also facilitates simultaneous or sequential formation of images and circuits on both major surfaces of the board. The substrate surfaces can be rendered opaque to light energy mechanically, i.e., by frosting with sandblasting and the like, or chemically by etching with appropriate reagents, such as chromic acid for resins and hydrogen fluoride for glass, alkali for porcelain, and the like. Frosted surfaces will scatter rather than absorb incident energy. On the other hand, energy absorbing substances can be dispersed in the substrate or adsorbed on the surface thereof to render the substrate opaque. By way of illustration, pigments, such as carbon black and titanium dioxide, are useful to prevent penetration by light in the visible wavelengths; bismuth, tin, lead and thorium compounds, as well as organic iodine compounds are useful as X-ray radiation and electron barriers. Lead compounds are useful neutron shields. The substrate can be rendered opaque to light energy, particularly at visible or ultraviolet wavelengths with a conventional compound, such as a hydroxy benzophenone, a hydroxy benzotriazole or a substituted acrylate, and the like.

A surface of the substrate is selectively deposited with an electrically non-conductive layer or real image comprising nuclei of a metal species, e.g. a metal, which is capable of catalyzing the deposition of electroless metal from an electroless metal deposition solution with which it is destined to be exposed or treated. The real image typically comprises metal species nuclei, e.g. metal nuclei, in which the metals are selected from Groups VIII and IB of the Periodic Table of Elements. Preferred metals are selected from Period 4 of Groups VIII and IB; iron, cobalt, nickel and copper. Especially preferred for the production of the real image is copper.

If desired, the surface can be coated with an adhesive before being coated with the compositions of this invention.

In producing the real image, the metal species nuclei are reduced from their salt or a composition of the salt in situ in selected areas on the surface of the substrate by application of radiant energy, e.g., thermal or light, such as ultraviolet light and visible light, X-rays, electron beams, and the like, or by treatment with a chemical reducing agent.

The reducible metal salt can comprise, in general, a cation selected from the metals of Group VIII and IB of the Periodic Table of the Elements. The anion associated in such metal salts can vary widely and can comprise organic and inorganic anions such as halides, sulfates, nitrates, formates, gluconates, acetates and the like. The cations in such salts will include copper, nickel, cobalt and iron, in any of the usual degrees of oxidation, e.g., both cuprous and cupric, ferrous and ferric, etc., will serve. Some typical salts include cupric formate, cupric gluconate, cupric acetate, cupric chloride, cupric nitrate, nickel chloride, cobalt chloride, ferrous sulfate and cobalt chloride.

In one manner of proceeding, a sensitizing solution comprising a heat-reducible metal salt, e.g., cupric formate, and optionally a developer, e.g., glycerine, and a surfactant in a suitable solvent, e.g. water, an alcohol, a mixture of water and an alcohol, dimethylformamide, dimethyl sulfoxide, is coated onto the substrate surface to form a layer thereof and dried. Selected areas of the layer of the coated surface are heated, e.g. at 100° to 170° C., preferably at 130° to 140° C., with a suitable means, e.g. a hot die, until the metallic salt has been reduced to the non-conductive real image comprising reduced metal salt species, e.g. metallic nuclei of copper, nickel, cobalt or iron.

In more detail, according to such a heat activation process, the entire substrate surface is coated with a layer of the metal salt sensitizing solution and the reduced real image produced by heating selected areas. The surface is typically dip coated with a solution of heat reducible metal salt, e.g. cupric formate and, optionally, a developer, e.g., glycerine, and a surfactant in the solvent. The surface is dried and is contacted directly with a heated object in those areas which are to be rendered catalytic to electroless metal by the reduction of the metal salt to catalytic nuclei. The heated object may be a metal surface which conforms exactly to the substrate surface. If a printed circuit is to be formed, a preformed die in the configuration of the circuit may be heated, e.g. to a temperature of 100° to 170° C., and applied to the surface. When removed, a circuit pattern of catalytic nuclei will remain which may then be metallized to form a conductive circuit pattern. A heated scribe may also be used to thermally reduce the metal salt. To prevent sticking, the heated object may be coated with an anti-sticking agent such as polytetrafluoroethylene. The temperature of heating can range from 100° to 170° C., but the preferred range is 130° to 140° C. The reduction is considered completed when the real image has darkened in color. The resultant reduced real image is catalytic to electroless metal deposition.

In another manner of proceeding, a sensitizing solution of a reducible metal salt composition, e.g. cupric formate, and a radiant energy-sensitive reducing agent contained in the suitable solvent, is applied to the substrate surface to form a sensitizing solution layer. The coated surface is typically dried and is then exposed through a positive or a negative of an original pattern or photograph, to form the real image on selected portions of the surface.

The radiant energy sensitive compound used in association with the reducible metal salt has the property of decomposing to a compound which will exercise a reducing action on the exposed metal salt. Such radiant energy-sensitive compounds form a family of scope well known to those skilled in the art. Among them may be mentioned ferric salts, dichromate compounds, anthraquinone and its compounds, amino acids, such as glycine, unsaturated organic compounds such as L-ascorbic acid, cinnamic acid, stilbenes, or azide compounds and the like. Because visible and ultraviolet light are the most convenient sources of radiant energy, the solutions used in this invention preferably contain such compounds which are sensitive to visible or ultraviolet light. Especially preferred are ferric salts, dichromates, anthraquinone and derivatives thereof. Illustrative among these are:

(a) ferric salts, such as ferric ammonium citrate (green or brown), ferric potassium citrate, ferric ammonium oxalate, ferric sodium oxalate, ferric potassium oxalate, ferric ammonium tartrate, ferric citrate, ferric oxalate, ferric chloride, ferric ammonium sulfate and the like;

(b) bichromate salts, such as those of the general formula $Me_2CrO_3.CrO_4$ wherein Me is any common metal cation, such as alkali metal, alkaline earth metal; ammonium or substituted ammonium, and the like. Some typical salts include sodium bichromate, potassium bichromate, or mixtures thereof with organic substances of animal or vegetable origin such as gelatin, fish glue, gum arabic, shellac, and the like, such as bichromated starch, and the like; and (c) anthraquinone or derivatives thereof, such as 9,10-anthraquinone, β-chloroanthraquinone, β-phenylanthraquinone, 1,2-benzanthraquinone, anthraquinone-2-sulfonic acid, anthraquinone-2,6 (or 2,7-)-disulfonic acid, and salts thereof, and particularly anthraquinone 2,6-disodium sulfonate, anthraquinone-2,7-disodium sulfonate, anthraquinone-2,7-dipotassium sulfonate, and the like. Other useful radiant energy-sensitive compounds will suggest themselves to those skilled in the art, and a wide variety of such compounds are shown, for example, in standard reference works such as J. Kosar, *Light Sensitive Systems,* John Wiley & Sons, New York (1965).

A preferred additional ingredient in the treating composition is a secondary reducer, such as an organic, oxygen-or nitrogen-containing compound. Such an ingredient serves to facilitate interaction of radiant energy and the radiant energy-sensitive compound to provide a reduction of the metal salt to the reduced metal salt species, e.g., free metal nuclei. Although the secondary reducer compound may be any oxidizable organic compound which is soluble in the solution, does not attack the base material, and is inert to the other ingredients, it is preferred that it comprise a hydroxy compound such as an alcohol or a polyol. Especially preferred as secondary reducing compounds are alcohols or polyols. Among the organic oxygenated compounds can be mentioned glycerol, ethylene glycol, pentaerythritol, mesoerythritol, 1,3-propanediol, sorbitol, mannitol, 1,2-butanediol, pinacol, sucrose, dextrin, polyethylene glycols, lactose, starch, gelatin, and the like. Also included are compounds such as triethanolamine and propylene oxide. Compounds which are also useful as secondary reducers are amino compounds, polyethers, certain dyestuffs and pigments. Among these may be mentioned aldehydes, such as formaldehyde, benzaldehyde; acetaldehyde; N-butyraldehyde, polyamides, such as nylon, albumin and gelatin; leuco bases of triphenylmethane dyes, such as 4-dimethylaminotriphenylmethane; leuco bases of xanthene dyes, such as 3,6-bisdimethylaminoxanthane and 3,6-bis-dimethylamino-9-(2-carboxyethyl)xanthene; polyethers, such as ethylene glycol diethyl ether, tetraethylene glycol dimethylether, alizarin, erythiocin, phthalocyanine blue, zirconium silicate and the like.

Additionally, other ingredients known as metal reduction intensifiers/accelerators/stabilizers may be added to the treating sensitizing solution to provide at least one of the following effects: (1) speed-up the exposure time, (2) help bring out the real image and provide better contrast, (3) provide anti-fogging, (4) lead to better definition and (5) stabilize the real image. For example, image formation can be accelerated; contrast can be improved, the need for the heat intensification can be eliminated and the stability of the image enhanced if to the solution comprising the metal salt and radiant energy-sensitive compound are added halogens, e.g., bromides and chlorides alone or in combination with metals such as tin, alkali metals, mercury, germanium, titanium, molybdenum, rare earths, amines, ammonia and the like. Illustrative of such compounds are: hydrogen halides and alkali metal or alkaline earth metal halides, ammonia or amine halides and the like. Particularly preferred are stannous chloride, hydrogen chloride, hydrogen bromide, potassium chloride and potassium bromide. In some embodiments the recited compounds may be used with organic acids such as mono-, di-, tri-carboxylic acids or salts thereof and the like, for example, with acetic acid, citric acid, oxalic acid.

A particularly effective additive has been found to be ferrithiocyanide compounds, e.g., potassium ferrithiocyanide.

In addition to the metal reduction image intensifiers-/accelerators/stabilizers, the composition comprising the metal salt and the radiant energy-sensitive compound can include also a surfactant, for those surfaces which are hard to wet with the particular sensitizing solution employed. The choice of the surfactant is not particularly critical, but usually it is preferred to use a non-ionic surfactant, because this permits a broader range in formulation. Among the suitable surfactants are polyethyleneoxy non-ionic ethers such as Triton-X 100, manufactured by Rohm & Haas Company, and non-ionic surfactants based on the reaction between nonylphenol and glycidol such as surfactants 6G and 10G manufactured by the Olin Company. Also suitable are fluorocarbon surfactants such as perfluorodecanoic acid and the series of related compounds manufactured by the 3M Company under the product designation FC-170 and the like.

The treating sensitizing solution may be formulated within broad concentration ranges, depending primarily on the relative amount of metal salt composition desired to be placed on the substrate surface, which in turn will depend on the mode of application, e.g., immersion, dip coating, roller coating, curtain coating, spraying and the like. In addition, the concentration of the ingredients in solution will be limited by solubility in the solvent. In general, the metal salt concentration will be predetermined and the amounts of radiant energy-sensitive compound and other ingredients, if present, will be adjusted to provide a ratio which will insure the desired result. This is well within the skill of those familiar with the art of formulating radiant energy sensitive systems. For example, at least enough radiant energy-sensitive compound will be present to facilitate substantially complete reduction by exposure to radiant energy of the metal salt to the catalytic reduced metal species nuclei, e.g. to the free metal nuclei. Usually to insure complete reduction, a substantial excess of the radiant energy-sensitive compound (based on the reducible metal ions) will be present. The metal salt concentration in solutions can vary over wide limits, e.g., from 0.5 to 100 grams or more per liter can be used but it is most convenient and economical not to use more than about 25 grams per liter and preferably less than about 15 grams per liter. The radiant energy-sensitive compound can comprise from about 1 to 10 or more equivalents, based on the metal salt. The amount of the secondary reducer, e.g., glycerol, sorbitol, pentaerythritol, dyestuff or the like, can likewise vary over a wide range, e.g., from 0.5 to 500 grams per liter, but in the case of difficult to volatilize liquid compounds, it is preferred not to include so much of such compounds that the treated surface is wet or sticky to the touch after drying. The ingredients, such as halide ions, stannous halides and carboxylic acids added to the compositions as image intensifers, accelerators, stabilizers, etc., will generally be used in relatively low concentrations, e.g., from trace amounts, e.g., from about 1 mg. per liter up to about 2 grams per liter. The amount of ferrithiocyanide compounds ranges from 50 to 150 parts per million. Surfactants will be used in small, but conventional quantities, if present. The non-ionics will be used at levels from about 0.1 to 2 grams per liter and anionics from about 0.1 to 1.0 gram per liter.

In still another manner of proceeding, a sensitizing solution comprising a reducible metal salt, e.g., cupric formate, cupric gluconate, cupric acetate, cupric chloride, nickelous chloride, cobaltous chloride or ferrous sulfate, etc., in the suitable solvent, optionally containing glycerine and surface active agents, is coated over the entire substrate surface, dried and then selectively exposed to a chemical reducing agent, e.g., an alkali metal borohydride, e.g., sodium or potassium borohydride, an alkali metal hydrosulfite, e.g., sodium hydrosulfite, or an amine borane, e.g., dimethylamine borane or morpholine borane, in an aqueous or non-aqueous solvent, e.g., water or methanol, for about 1 to 2 minutes or until the formation of the real image comprising reduced metal species nuclei is complete.

In more detail, in such a chemical reduction process, the substrate, if necessary, is cleaned and roughened by methods described in the patents incorporated hereinto by reference. The substrate surface is then coated with a sensitizing solution, for a short time, e.g., 1 to 5 minutes, and allowed to dry. The drying rate is not critical but it is dependent on the method of drying and the temperature used. Temperatures above 170° C. are not preferred however.

In all cases the coated substrate surface should be dry before the selective exposure to radiant energy and preferably dry before exposure to reducing agents, as the case may be. Otherwise, images may reverse. In all such embodiments, the metal accelerators described above will provide enhanced rates of image formation.

The surface, having a layer of the dry sensitizing composition thereon, is next selectively treated, e.g. as by stencilling with a chemical reducing solution, e.g., sodium borohydride solution, for about 1 to 2 minutes until selected areas (a pattern) of the surface so treated are substantially darkened in color. This indicates that the metal salt has been reduced to form the resultant real image or pattern, comprising metal species nuclei, e.g., metallic nuclei of copper, nickel, cobalt or iron.

Upon formation of the catalytic real image on the substrate surface, the surface has heretofore been water rinsed or washed in an attempt to remove the background, i.e., to wash out the unreduced portions of the sensitizing solution layer on the surface. The water washed or rinsed substrate is then immersed in an electroless metal deposition solution. However, after only a relatively few immersions of substrates containing real images, the electroless metal deposition solution goes critical whereby it is no longer capable of catalytically depositing therefrom an electroless metal deposit, e.g., typically after one square foot of real-image surface has passed through about 0.026 gallon of electroless metal deposition solution. This is a very serious problem where mass-produced printed wiring board manufacture is contemplated with the above-described processes. It has been found, however, that the problem of the electroless solution going critical is attributable to the sensitizing solution layer components which have not been adequately removed by the water rinsing and have thereby entered into the electroless metal deposition solution.

The problem is obviated by treating the substrate surface, containing the real image and the untreated or unreacted background material comprising at least the unreduced non-noble metal salt, with a suitable stripping solution. A suitable stripping solution comprises a suitable stripper. Suitable strippers include organic acids such as citric acid and a monocarboxylic acid having the structural formula of

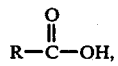

where R is a member selected from the hydrogen atom and an alkyl group having 1 to 3 carbon atoms. Particularly preferred of the monocarboxylic acids are formic acid and acetic acid. The strippers are typically combined with a suitable solvent therefor, such as water, alcohol, methanol, isopropanol, n-propanol, etc., which is chemically inert with respect to the substrate surface to be treated and the real image contained thereon, to form the stripping solution. The concentration of the stripper in the stripping solution is not critical, the stripper being present in an amount sufficient to remove the background material upon treatment therewith.

The surface containing the real image and background is treated with the stripping solution, e.g., a one weight percent stripper solution, in any conventional manner, e.g., spraying, dipping, etc., for a period of time, e.g., 5 seconds to 10 minutes at 25° C. sufficient to remove the background material, e.g., cupric formate, the sodium salt of 2,6-anthraquinone disulfonic acid, secondary reducing agent. Such a period of time at a particular temperature and with a particular stripper or stripper solution is readily ascertained experimentally by one skilled in the art in view of the disclosure contained herein.

After stripping away the background material, the substrate is rinsed in running water for a short time, e.g., 1 to 5 minutes, and is then immersed in a suitable electroless metal deposition solution to deposit an electroless metal deposit on the real image.

Suitable electroless metal deposition solutions are well known in the art and will not be elaborated herein. Reference in this regard is made to the patents incorporated hereinto by reference, which disclose some suitable electroless metal deposition solutions.

The resultant electroless metal deposit may be built up to a desired thickness by prolonged exposure to the electroless metal deposition solution or, alternatively, may be further built up by being electroplated in a standard electroplating bath. Again, the various typical electroplating solutions, plating conditions and procedures are well known in the art and will not be elaborated herein. Again, reference in this regard is made to U.S. Pat. Nos. 3,772,056; 3,772,078; 3,907,621; 3,925,578; and 3,930,963, incorporated hereinto by reference.

EXAMPLE I

For comparison purposes, a substrate comprising a steel core with a fully cured diglycidyl ether of bisphenol A coating thereon was selected. The substrate comprised about 200 through holes having a diameter of about 0.050 inch. The substrate was immersed in a solvent bath comprising methyl ethyl ketone for ten minutes at 25° C. The substrate was water rinsed for one minute at 25° C. and then etched in an aqueous solution comprising 360 grams of $CrO_3$, 250 grams $H_3PO_4$ and 180 grams $H_2SO_4$ in 1000 ml. of water, maintained at 25° C., for ten minutes. The etched substrate was then water rinsed at 25° C. for ten minutes.

A sensitizing solution was prepared by dissolving 21.5 grams of cupric formate, 16 grams of 2,6-anthraquinone disulfonic acid disodium salt and 66 grams of sorbitol in a solvent comprising 1000 ml. of water. The etched substrate was immersed in the sensitizing solution for one minute at 25° C., removed therefrom and dried at 90° to 100° C. for three minutes. A surface of the dried substrate was selectively exposed to a high-pressure mercury discharge lamp (30 watts/cm² surface at 3660 A.) for 90 seconds to form a real image. The exposed surface was water rinsed for one minute and then immersed for 15 minutes at 25° C. in a conventional electroless metal deposition solution comprising cupric sulfate, formaldehyde, sodium cyanide, alkali and EDTA, to obtain a 0.05 mil electroless copper-deposited pattern corresponding to the real image.

The above procedure was repeated with a plurality of boards. After 10 boards (about one square foot per about 0.026 gallon of electroless solution) were immersed in the electroless metal deposition solution the electroless metal deposition went critical. Upon processing of the eleventh board through the electroless metal deposition solution, an electroless copper deposit was not obtained thereon.

EXAMPLE II

The procedure of Example I was repeated except that after the real image was formed, the real image containing surface was immersed in a one weight percent aqueous acetic acid stripping solution for one minute at 25° C. The stripping solution treated surface was then water washed at 25° C. for one minute and immersed in the electroless copper deposition solution for 15 minutes at 25° C. to obtain a 0.05 mil electroless copper-deposited pattern corresponding to the real image.

The above procedure was repeated with 125 boards which were immersed in the 0.026 gallon electroless copper deposition solution over a five-day period without causing the electroless copper solution to go critical.

EXAMPLE III

The procedure of Example II was repeated except that the stripping solution contained one weight percent formic acid. Again 125 boards were passed through 0.026 gallon of the electroless copper solution without causing it to go critical.

EXAMPLE IV

The procedure of Example I was repeated. The amount of the sorbitol remaining on the boards after treatment with one weight percent aqueous acetic acid was determined by carbon 14 labelling of the sorbitol and counting the radiation from the carbon 14. With the one weight percent aqueous acetic acid stripper, treatment at 25° C. for a time period ranging from 15 to 60 minutes removed in excess of 99.5 percent of the sorbitol.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method for selectively depositing a metal on a surface, which comprises:
   (a) coating the surface with a sensitizing solution comprising at least a reducible salt of a non-noble metal to form a sensitized surface;
   (b) selectively treating a portion of said sensitized surface to form a catalytic real image; and
   (c) exposing said real image containing surface to a stripper comprising an organic acid selected from the group consisting of (a') a monocarboxylic acid having a structural formula of $$R-\overset{O}{\underset{\|}{C}}-OH,$$

where R is a member selected from the group consisting of H and an alkyl group having 1 to 3 carbon atoms, (b') citric acid and (c') a mixture of (a') and (b'), to essentially selectively remove untreated portions of said sensitized surface.

2. The method as defined in claim 1 which further comprises exposing said real image to an electroless metal deposition solution to deposit an electroless metal deposit thereon.

3. The method as defined in claim 1 wherein said salt is selected from the group consisting of reducible copper, nickel, cobalt and iron salts.

4. The method as defined in claim 1 wherein in step (b) said treating to form said real image comprises exposing said sensitized surface to a source of light radiant energy.

5. The method as defined in claim 4 wherein said real image is formed by selectively exposing said sensitized surface to ultraviolet radiation.

6. The method as defined in claim 4 wherein said sensitizing solution comprises the reducible metal salt, a radiation-sensitive reducing agent for said salt and a secondary reducer.

7. The method as defined in claim 6 wherein said reducing agent is a light-sensitive reducing compound selected from the group of light sensitive reducing compounds consisting of ferric salts, dichromates, anthraquinone disulfonic acids and salts, glycine and L-ascorbic acid.

8. The method as defined in claim 7 wherein said secondary reducer comprises a polyhydroxy alcohol.

9. The method as defined in claim 1 wherein in step (b) said treating to reduce said metal salt comprises exposing said sensitized surface to a chemical reducing agent.

10. The method as defined in claim 1 wherein in step (b) said treating to reduce said salt comprises heating said sensitized surface to attain a thermal reduction.

11. The method as defined in claim 1 wherein said stripper comprises formic acid.

12. The method as defined in claim 1 wherein said stripper comprises acetic acid.

13. A method for selectively depositing a metal on a surface of a substrate which comprises:
   (a) sensitizing the surface by treating the surface with a photosensitive composition comprising at least a reducible salt of a non-noble metal and a radiation sensitive reducing agent for said salt;
   (b) exposing selected areas of said sensitized surface to a source of light radiant energy in a selected pattern to reduce said metal salt to a reduced metal salt species to produce a real image of the reduced metal salt species in said selected pattern which is capable of directly catalyzing the deposition thereon of a metal from an electroless metal deposition solution; and
   (c) treating said selectively light radiant energy exposed surface with a stripper comprising an organic acid selected from the group consisting of (a') a monocarboxylic acid having a structural formula of

where R is a member selected from the group consisting of H and an alkyl group having 1 to 3 carbon atoms, (b') citric acid and (c') a mixture of (a') and (b'), to essentially selectively remove said photosensitive composition from radiation unexposed areas of said sensitized surface.

14. The method as defined in claim 13 which further comprises exposing said real image to an electroless metal deposition solution to deposit an electroless metal deposit thereon.

15. The method as defined in claim 13 wherein said salt is selected from the group consisting of reducible copper, nickel, cobalt and iron salts.

16. The method as defined in claim 15 wherein said metal salt is reduced by selective exposure to a source of ultraviolet radiation.

17. The method as defined in claim 16 wherein said sensitizing composition additionally comprises a secondary reducer.

18. The method as defined in claim 17 wherein said reducing agent is a radiation-sensitive reducing compound selected from the group of radiation-sensitive compounds consisting of ferric salts, dichromates, anthraquinone disulfonic acids and salts, glycine acid, L-ascorbic acid; and said secondary reducer comprises a polyhydroxy alcohol.

19. The method as defined in claim 17 wherein:
said reducible salt is a salt of copper,
said reducing agent is selected from the group consisting of anthraquinone and derivatives thereof, and
said secondary reducer comprises sorbitol.

20. The method as defined in claim 19 wherein said stripper comprises formic acid.

21. The method as defined in claim 19 wherein said stripper comprises acetic acid.

22. A method for making a printed circuit board, which comprises:
(a) treating an electrically non-conductive base with a sensitizing composition comprising at least a reducible salt of copper and a radiation-sensitive reducing compound for said reducible salt;
(b) exposing said treated base to a source of light radiant energy in selected areas to reduce the metal salt to produce a reduced metal salt species in the form of a real image corresponding to the desired circuit pattern;
(c) treating said exposed base with a stripper comprising a carboxylic acid selected from (a') citric acid, (b') a monocarboxylic acid having the structural formula

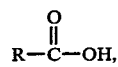

wherein R is a member selected from the hydrogen atom and an alkyl group having 1 to 3 carbon atoms and (c') a mixture of (a') and (b'), to remove radiation unexposed portions of said sensitizing composition; and
(d) exposing said real image to an electroless metal deposition solution to deposit an electroless metal thereon.

23. The method as defined in claim 22 wherein:
said composition comprises a reducing agent selected from anthraquinone and derivatives thereof, and
said composition additionally comprising a secondary reducer comprising sorbitol.

24. The method as defined in claim 23 wherein said monocarboxylic acid is selected from formic acid, acetic acid and a mixture of the foregoing acids.

* * * * *